(12) United States Patent
Kunz et al.

(10) Patent No.: US 6,414,515 B1
(45) Date of Patent: Jul. 2, 2002

(54) FAILSAFE INTERFACE CIRCUIT WITH EXTENDED DRAIN DEVICES

(75) Inventors: Keith E. Kunz, Plano; James D. Huffman, Richardson, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/713,581

(22) Filed: Nov. 15, 2000

Related U.S. Application Data

(60) Provisional application No. 60/172,720, filed on Dec. 20, 1999.

(51) Int. Cl.$^7$ .......................................... H03K 19/094
(52) U.S. Cl. ........................................ 326/81; 326/83
(58) Field of Search .............................. 326/80, 81, 83, 326/86; 327/534, 535

(56) References Cited

U.S. PATENT DOCUMENTS

| | | | |
|---|---|---|---|
| 5,424,659 A | * 6/1995 | Stephens et al. | 326/81 |
| 5,448,198 A | * 9/1995 | Toyoshima et al. | 326/81 |
| 5,719,525 A | * 2/1998 | Khoury | 327/535 |
| 5,880,602 A | * 3/1999 | Kaminaga et al. | 326/81 |
| 5,933,027 A | * 8/1999 | Morris et al. | 326/81 |

* cited by examiner

*Primary Examiner*—Don Phu Le
(74) *Attorney, Agent, or Firm*—Robert D. Marshall, Jr.; W. James Brady, III; Frederick J. Telecky, Jr.

(57) ABSTRACT

Failsafe interface circuits are provided for an integrated circuit having a core logic section providing a signal to, or receiving a signal from, a bond pad connection. The interface circuits employ high voltage tolerant, extended drain devices in circuit arrangements which insure that the stress of a failsafe event is only exhibited by the extended drain devices. A failsafe event is defined as a bond pad voltage which exceeds the supply voltage of the integrated circuit plus the threshold voltage of the transistors within the integrated circuit. Both failsafe output driver circuit and failsafe receiver circuit embodiments are provided.

7 Claims, 3 Drawing Sheets

FAILSAFE INTERFACE CIRCUIT WITH EXTENDED DRAIN DEVICES

This application claims priority under 35 USC §119(e)(1) of Provisional Application No. 60/172,720, filed Dec. 20, 1999.

TECHNICAL FIELD OF THE INVENTION

This invention relates generally to the field of integrated circuit devices, and more particularly to failsafe interface circuits for integrated circuit devices.

BACKGROUND OF THE INVENTION

As integrated circuit electronics become part of virtually every portable and low power electronic system, the need for efficient low voltage devices continues to grow. Where the standard operating voltage for integrated circuit components in the last decade was generally about five volts, the recent trend has been to reduce the operating voltage to three (3) volts and even 1.8 volts in an effort to make these systems more compatible with battery operation.

Many of today's electronic systems are modular and two or more subsystems require the ability to be electrically engaged and disengaged from one another while one of the subsystems is operational. This requirement, referred to as "hot plugging," presents significant stresses on the interface circuitry due to the inconsistent application of power to the input/output pins and the supply voltage of the system which is initially powered down. Such electrical stress can damage the integrated circuit.

Integrated circuits can also suffer stress, and failure, when a voltage is applied to an input or output pin of the device which exceeds the operational voltage of the device. Under such conditions, it is desirable to operate in a manner that diverts the excess current and/or voltage away from any device which is sensitive to these extreme conditions.

Accordingly, failsafe interface circuitry to protect an electronic circuit, such as an integrated circuit, from damage during an over voltage condition or hot plugging situation is required.

SUMMARY OF THE INVENTION

Accordingly, a need has arisen in the art for improved failsafe interface circuits. The present invention provides interface circuits, both input (receiver circuits) and output (driver) circuits, that substantially reduce or eliminate problems associated with prior interface circuitry.

In accordance with the present invention, a failsafe interface circuit is provided for an integrated circuit which has a core logic section that provides an output signal to a bond pad connection. The interface circuit includes an extended drain driver circuit operatively coupled to the bond pad. A failsafe detect circuit is included and provides a bias signal, which in the event of a failsafe event, has a voltage which is less than a voltage on the bond pad. In this respect, a failsafe event is defined as a bond pad voltage which exceeds the supply voltage of the integrated circuit plus the threshold voltage of the transistors which form the integrated circuit. A failsafe gate switch circuit is interposed between the core logic and the extended drain driver circuit. The failsafe gate switch is responsive to the output signal from the core logic during normal operation and is responsive to the bias signal during a failsafe event. The failsafe gate switch creates a substantially open path between the bond pad and the core logic during a failsafe event. A failsafe well switch circuit provides a well voltage signal to the extended drain driver circuit. The well voltage signal has a value which is the greater of the voltage at the bond pad or a supply voltage to the integrated circuit, such that voltage stress on the extended drain driver circuit is minimized. Those devices which will be subjected to the high voltage associated with the failsafe event are formed as extended drain devices.

Preferably, the extended drain driver circuit is formed with a P-channel extended drain transistor providing an active pull-up to the bond pad and an N-channel extended drain transistor providing an active pull-down to the bond pad.

It is also preferred that the bias signal generated by the failsafe detect circuit is substantially equal to $2/3$ of the voltage on the bond pad during a failsafe event. However, this voltage can range from $1/2$ to $3/4$ of the bond pad voltage and still achieve a reasonable failsafe effect.

In one embodiment, the failsafe gate switch includes a pass gate circuit interposed between the core logic and the output driver. The pass gate circuit is formed with an extended drain N-channel device having a source terminal coupled to the core logic output, a drain terminal coupled to the output driver circuit and a gate terminal coupled to supply voltage of the integrated circuit. The pass gate further includes an extended drain P-channel device having a drain terminal coupled to the core logic output, a source terminal coupled to the output driver circuit and a gate terminal coupled to a signal LO. The signal LO is generated such that the signal is low during normal operation and substantially equal to the voltage at the bond pad during a failsafe event.

In another embodiment of the present invention, a failsafe interface circuit is formed for an integrated circuit having a core logic section which receives a signal applied to a bond pad connection. The interface circuit includes an invertor circuit with an output coupled to the core logic input. An extended drain N-channel device has a source terminal coupled to the invertor input, a drain terminal coupled to the bond pad connection and a gate terminal coupled to the supply voltage of the integrated circuit. An extended drain P-channel device has a drain terminal coupled to the invertor input, a source terminal coupled to the bond pad connection and a gate terminal coupled to a signal LO. As with the previously described failsafe gate switch circuit, the signal LO is low during normal operation and substantially equal to the voltage at the bond pad during a failsafe event. A diode is included which is coupled from the invertor input to a supply voltage in the integrated circuit.

A technical advantage of the present invention includes providing an interface circuit which reliably withstands a failsafe event, whether or not power is supplied to the integrated circuit. An additional technical advantage of the present invention is that there is no substantial DC current path to the integrated circuit power supply during a failsafe event. Yet another technical advantage of the present invention is that a failsafe interface circuit is provided which is formed using thin oxide transistors.

Other technical advantages of the present invention will be readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
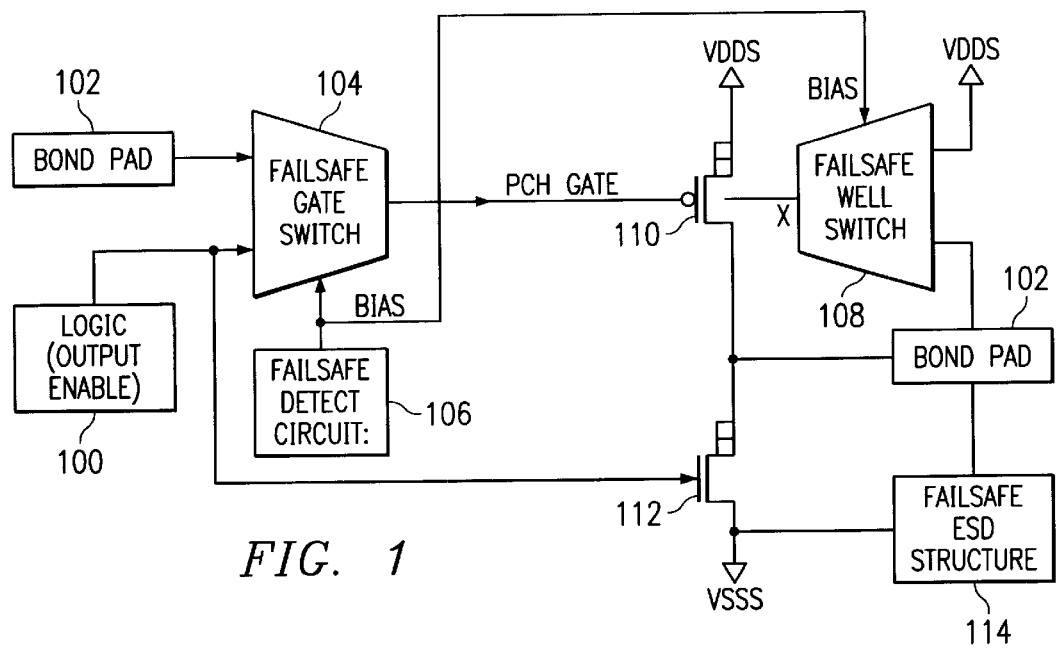
FIG. 1 is a simplified schematic diagram of a failsafe output driver circuit in accordance with the present invention.

The preferred embodiments of the present invention and advantages thereof are best understood by referring now in more detail to the drawings, in which like numerals refer to like parts.

As used herein, a "failsafe event" is defined as an applied voltage occurring at a bond pad of an integrated circuit which is greater than the supply voltage of the integrated circuit plus the threshold voltage of the transistors which form the integrated circuit (Failsafe $\geq V_{DDS}+V_t$, where $V_{DDS}$ ranges from 0 volts to the maximum allowable supply voltage to the integrated circuit). Thus, a pad voltage ($V_{pad}$) which results in a failsafe event is a variable which depends on the actual supply voltage which is operating the device.

The present invention employs extended drain transistors in the circuit embodiments described herein as high-voltage tolerant devices. Such devices are shown in the drawings by an enlarged rectangular identifier on the drain terminal of those transistors which are so extended. Extended drain transistors are generally known in the art. One such device is described in U.S. Provisional Application No. 60/161,777, filed on Oct. 27, 1999, now U.S. patent application Ser. No. 09/669,391, filed Sep. 26, 2000 entitled "HIGHER VOLTAGE TRANSISTORS FOR SUBMICRON CMOS PROCESSES," which is hereby incorporated by reference in its entirety.

FIG. 1 is a schematic diagram which illustrates a failsafe output driver circuit formed in accordance with the present invention. Such a circuit protects the core logic 100 of an integrated circuit from stress, and resulting damage, from failsafe events which occur at the bond pad 102. The failsafe output driver circuit includes a failsafe gate switch circuit 104, a failsafe detect circuit 106, a failsafe well switch circuit 108, and an extended drain driver circuit including an extended source p-channel (PCH) transistor 110 and an extended drain n-channel (NCH) transistor 112. Preferably, the circuit also includes a failsafe ESD circuit or-structure 114 which is connected from the bond pad 102 to a circuit ground potential ($V_{SSS}$). A failsafe ESD circuit is one which does not require a DC current for a bias voltage and can be formed in a process that uses a silicide, shallow trench isolation, and thin gate oxide transistors.

The failsafe detect circuit 106 generates a BIAS signal. The BIAS signal can be selected to have a value in the range from about ½ to about ¾ of $V_{pad}$ during a failsafe event. However, it is preferred that the BIAS signal have a magnitude of ⅔ that of the voltage applied to the bond pad 102 ($V_{pad}$) during a failsafe event. During normal operation, the BIAS signal has a voltage substantially equal to $V_{DDS}$ of the integrated circuit. The BIAS signal is applied to the failsafe gate switch circuit 104 in addition to the failsafe well switch circuit 108.

Figure 2:
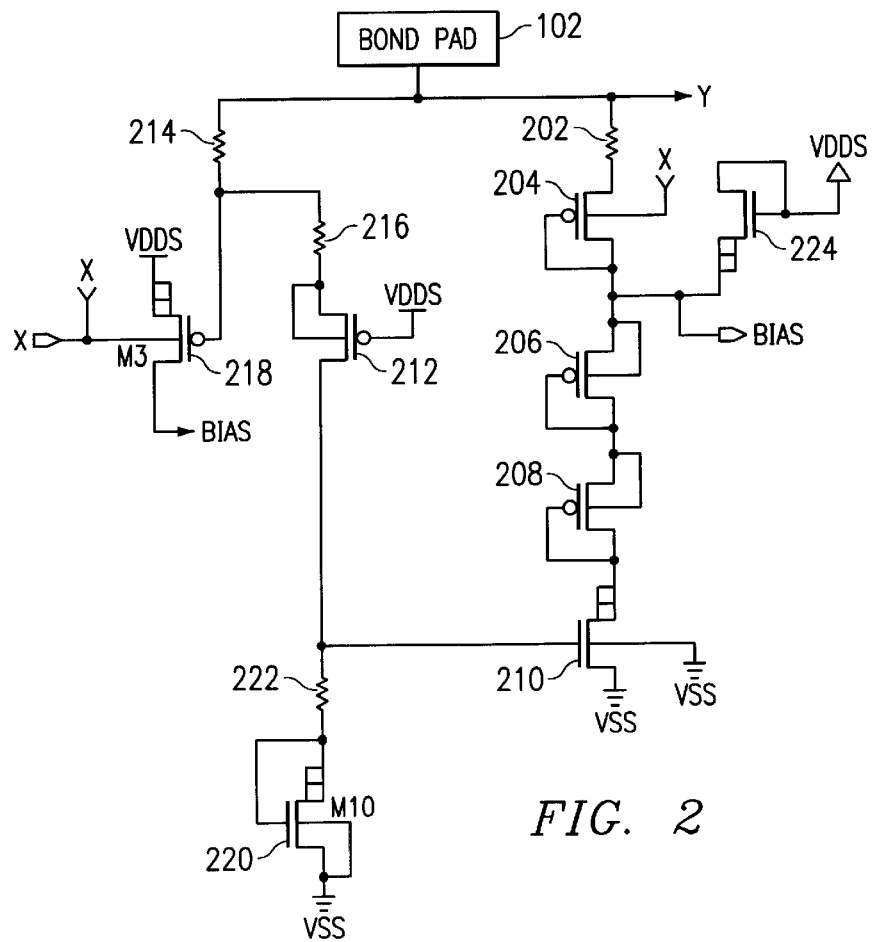
FIG. 2 is a schematic diagram further illustrating a failsafe detect circuit, for use in the failsafe interface circuits of the present invention.

FIG. 2 illustrates an exemplary embodiment of a failsafe detect circuit in accordance with the present invention. The bond pad 102 is connected through resistor 202 to series diode-connected (gate connected to source) PCH transistors 204, 206, 208 which are connected through an extended drain NCH device 210 to a circuit ground potential, $V_{SSS}$. Transistors 204, 206, 208 are substantially identical and are arranged as a voltage divider with the bias signal being taken from a source-drain junction of transistors 204, 206. A fourth PCH transistor 212 is connected to the bond pad 102 through resistors 214, 216. The gate of transistor 212 is connected to $V_{DDS}$. When a failsafe event occurs ($V_{pad} > V_{DDS}+V_t$), transistor 212 turns ON and applies a voltage to the gate of extended drain transistor 210 which turns transistor 210 ON as well. When ON, the drain to source resistance of the extended drain transistor 210 is negligible in comparison to the resistance of the transistors 204, 206, 208. As a result, during a failsafe event, ⅓ of $V_{pad}$ is dropped across each of transistors 204, 206, 208, such that the BIAS signal achieves a level of ⅔ $V_{pad}$. The well of transistor 204 is connected to signal X, which is developed by the failsafe well switch circuit 108, and has a magnitude substantially equal to the pad voltage during a failsafe event. By connecting the well to this signal X, no current path is provided from BIAS to the bond pad 102 during normal operation. In transistors 206 and 208, the well is connected to the drain terminal of the respective transistor. In this arrangement, the maximum voltage developed across any two terminals, including the well, of transistors 204, 206, 206 is $V_{pad}/3$. Therefore, there is no need to make these transistors high-voltage tolerant, extended drain devices. Resistor 216, which is interposed between transistor 212 and the bond pad 102, operates in conjunction with transistor 220 and resistor 222, which are connected in series to the source of transistor 212, to establish a voltage divider circuit which limits the voltage developed across transistor 212. In this way, transistor 212 is protected from the over voltage condition associated with a failsafe event, thus obviating the need for an extended drain transistor in this location.

During normal operation (e.g., not a failsafe event) it is desirable for the BIAS signal to be greater than or equal to the pad voltage. To insure that this condition is satisfied, a PCH transistor 218 is included with the gate connected to the bond pad 102 through resistor 214, the drain connected to $V_{DDS}$ and the source connected to the BIAS signal output.

It is preferred that the failsafe detect circuit include a diode connected, extended drain NCH transistor coupled between $V_{DDS}$ and the BIAS signal. This NCH transistor, which is a fast acting device, maintains the BIAS signal at a voltage of at least $V_{DDS}-V_t$. This is important during transitions, such as from a failsafe event back to normal operating condition. During such a transition, the PCH transistor 218 will start to turn on to bring BIAS to $V_{DDS}$. However, because the response time of the PCH device is fairly slow, and its gate terminal is driven through resistor 214 which generates an R–C time constant with the parasitic capacitance of the device, the BIAS signal may initially drop below $V_{DDS}$ during the transition. Transistor 224 minimizes this effect.

Figure 3:
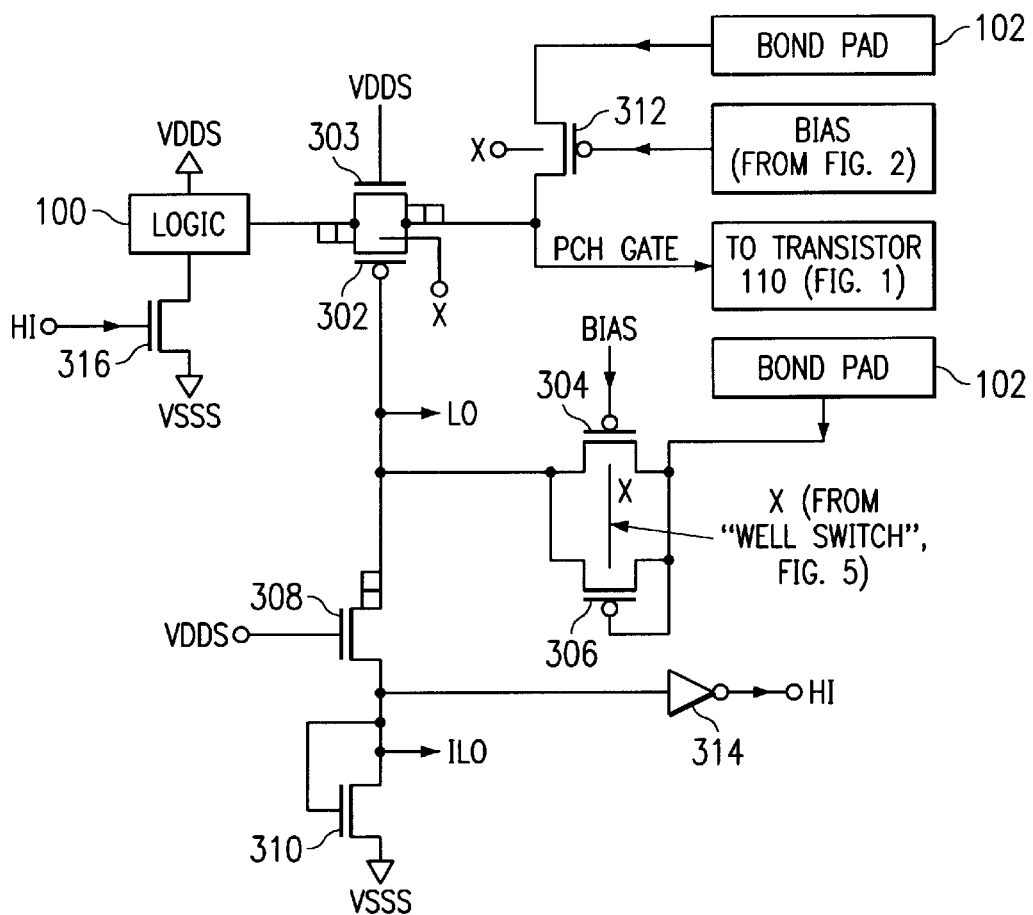
FIG. 3 is a schematic diagram further illustrating the failsafe gate switch circuit, for use in the failsafe interface circuits of the present invention.

As noted above, the output signal from the core logic 100 is applied to the failsafe gate switch 104 which develops a PCH gate signal to drive the gate of extended source PCH transistor 110 of the output driver circuit. FIG. 3 is a schematic diagram which further illustrates an exemplary embodiment of a failsafe gate switch circuit. The signal from the core logic 100 is applied to a pass gate which is formed from extended drain PCH transistor 302 and extended drain NCH transistor 303. The gate of extended drain transistor 303 is connected to $V_{DDS}$. The gate of extended drain PCH transistor 302 is coupled to signal LO, which is low during normal operation and goes high during a failsafe event. In this way, during normal operation, the signal PCH gate, which is developed at the output of the pass gate circuit, tracks the logic level from the core logic circuit 100.

The signal LO is generated by transistors 304, 306, 308 and 310. The drain of transistor 304 is connected to the bond pad 102 and the gate of this transistor is connected to the BIAS signal. During normal operation, the BIAS signal is substantially equal to the bond pad voltage ($V_{pad}$), thus transistor 304 is OFF. An extended drain NCH transistor 308 is included with the extended drain connected to the source of transistor 304, the gate connected to $V_{DDS}$, and the source connected to $V_{SSS}$ via diode connected transistor 310. When transistor 304 is OFF, transistor 308 is ON, which forces the signal LO to about $V_{SSS}$ (low). During a failsafe event, the BIAS signal drops below $V_{pad}$, such as to ⅔ $V_{pad}$, turning transistor 304 ON and allowing signal LO to track $V_{pad}$.

During a failsafe event, the PCH gate signal substantially tracks the voltage on the bond pad 102. A PCH transistor 312 has its drain terminal connected to the bond pad 102, its gate terminal coupled to the BIAS signal and its source terminal coupled to the PCH gate signal line. During a failsafe event, the BIAS signal drops below $V_{pad}$, turning on transistor 312, thus allowing PCH gate to substantially track $V_{pad}$. As the maximum voltage which will be developed across any two terminals of transistor 312 is $V_{pad}/3$, there is no need to fabricate this transistor as an extended drain device.

Signal ILO, which is developed across transistor 310, tracks signal LO but at a significantly lower voltage level. Thus, during a failsafe event, signal ILO will be a logic level high, yet well below the pad voltage. The ILO signal is useful for safely indicating a failsafe event to the core logic 100. The ILO signal can also be applied to an invertor 314 to generate a signal HI, which can be applied to transistor 316 to open the current path between logic 100 and $V_{SSS}$ during a failsafe event.

Figure 4:
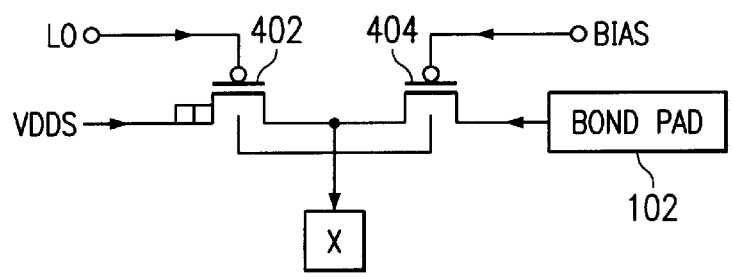
FIG. 4 is a schematic diagram of a failsafe well switch circuit, for use in the failsafe interface circuits of the present invention.

The failsafe well switch circuit 108 provides a well bias signal X which is applied to the well of extended source PCH transistor 110 and other devices throughout the driver circuit. The signal X has the characteristic that its voltage value is substantially equal to $V_{DDS}$ during normal operation and substantially equal to $V_{pad}$ during a failsafe event. FIG. 4 is a schematic diagram of an exemplary well switch circuit 108. The circuit includes extended drain PCH transistor 402 and PCH transistor 404. Extended drain transistor 402 has its gate terminal coupled to the LO signal from the failsafe gate switch circuit of FIG. 3 and the extended drain terminal connected to $V_{DDS}$. During normal operation, the signal LO is low, transistor 402 is ON and signal X has a voltage substantially equal to $V_{DDS}$. Transistor 404 has a gate terminal coupled to the BIAS signal from the failsafe detect circuit of FIG. 2 and a drain terminal coupled to the bond pad 102. During a failsafe event, transistor 404 is ON and signal X substantially equals $V_{pad}$.

Figure 5:
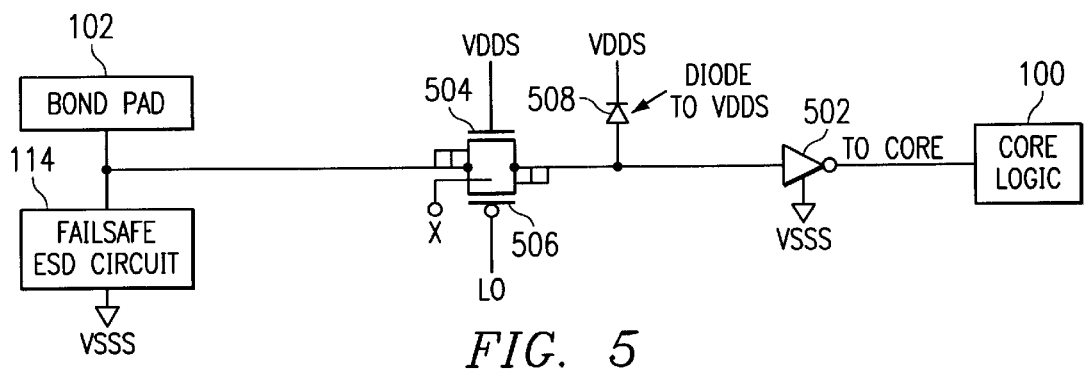
FIG. 5 is a simplified schematic diagram of a failsafe input circuit, or receiver circuit, in accordance with the present invention.

FIG. 5 is a schematic of a first embodiment of a failsafe input circuit, or signal receiver circuit, formed in accordance with the present invention. A signal applied on a bond pad 102 must be transmitted through a pass gate circuit and an invertor circuit 502 prior to being applied to the core logic circuit 100. The pass gate circuit is formed with extended drain NCH transistor 504 and extended drain PCH transistor 506. The gate of transistor 504 is coupled to $V_{DDS}$. The gate of transistor 506 is coupled to signal LO, which can be generated as illustrated in connection with FIG. 3. During normal operation, signal LO is low and the pass gate simply passes signals, with an inversion, from bond pad 102 to invertor 502 which restores the applied signal to its original polarity prior to application to the core logic 100. During a failsafe event, signal LO substantially tracks the bond pad voltage, which exceeds $V_{DDS}$, and turns off transistors 504 and 506. Any leakage voltage across transistors 504, 506 is clamped within a diode drop of $V_{DDS}$ by shunt diode 508. Since transistor 504 can see the full potential of the pad voltage from drain to gate during a failsafe event, this transistor is an extended drain device. A failsafe ESD structure 114 can also be coupled from the bond pad 102 to the integrated circuit ground potential.

Figure 6:
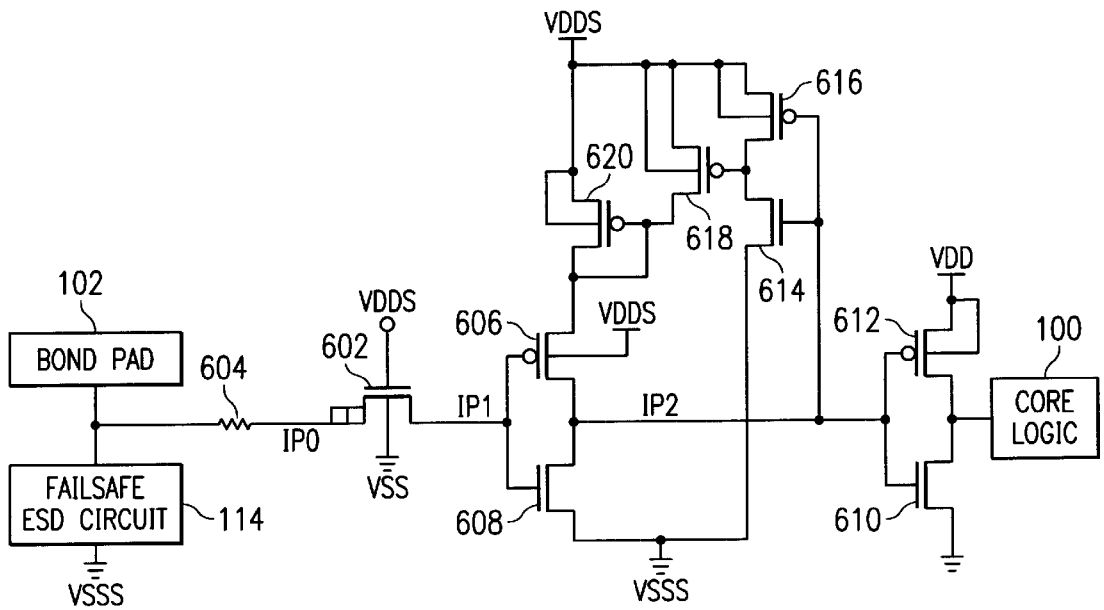
FIG. 6 is a simplified schematic diagram of another embodiment of a failsafe input circuit, or receiver circuit, in accordance with the present invention.

FIG. 6 is an alternate embodiment of a failsafe input circuit, formed in accordance with the present invention. In this embodiment, the input signal from the bond pad 102 is passed through a single extended drain NCH transistor 602, rather than the two extended drain devices 504, 506 in the pass gate circuit of FIG. 5. The extended drain of transistor 602 is coupled through a small resistor 604 to the bond pad 102. A failsafe ESD structure 114 can also be coupled from the bond pad 102 to the integrated circuit ground potential. The gate of transistor 602 is coupled to $V_{DDS}$, such that the source terminal of transistor 602 achieves a maximum value of $V_{DDS}-V_t$, where $V_t$ is the threshold voltage of the transistor 602. Transistors 606 and 608 are configured as an invertor which receives signal IP1 from transistor 602 and generates signal IP2 in response thereto. Transistors 610 and 612 are configured as an invertor which receives signal IP2 and provides a signal to the core logic 100. The signal IP2 is also applied to transistors 614, 616 which are configured as an invertor that provides a feedback signal to the gate of a PCH transistor 618. The source of transistor 618 is coupled to the gate-source connection of a diode connected PCH transistor 620 and the drain of transistor 606.

If the signal applied to the gate of transistor 618 is a logic level high, transistor 618 is off and transistor 620 acts as a diode interposed between $V_{DDS}$ and the source of transistor 606. In this case, transistor 620 operates to drop sufficient voltage from $V_{DDS}$ to the source of transistor 606 such that transistor 606 does not turn ON. This prevents both transistor 606 and 608 from simultaneously conducting when a voltage of $V_{DDS}-V_t$ is applied to the gates of these transistors. When the gate of transistor 618 is low, transistor 618 turns ON and applies $V_{DDS}$ to the source of transistor 606, enabling operation of this transistor.

The failsafe interface circuits described herein protect the core logic of an integrated circuit from over voltage conditions which can occur at the bond pad terminals of the device. Such conditions can occur from an improper connection to the device, signal transients on the bond pad connections or by hot plugging one device into another such that a pad voltage is applied before a $V_{DDS}$ is established. The use of extended drain devices strategically located within the interface circuits provides for high voltage tolerant failsafe circuits.

Although the present invention has been described with several embodiments, various changes and modifications may be suggested to one skilled in the art. It is intended that the present invention encompass such changes and modifications as fall within the scope of the appended claims.

What is claimed is:

1. A failsafe interface circuit for an integrated circuit having a core logic section providing a signal for a bond pad connection, the interface circuit comprising:

an extended drain driver circuit operatively coupled to the bond pad connection;

a failsafe detect circuit providing a bias signal which has a voltage less than a voltage on the bond pad connection during a failsafe event and which has a voltage substantially equal to a supply voltage during normal operation, a failsafe event being when said voltage on the bond pad is greater than said supply voltage plus a transistor threshold voltage;

a failsafe gate switch circuit interposed between the core logic section and said extended drain driver circuit, said failsafe gate switch circuit being responsive to an output signal from the core logic section during normal operation and being responsive to the bias signal, and creating a substantially open circuit path between the bond pad connection and the core logic section during a failsafe event; and a failsafe well switch circuit having an output providing a well voltage signal to the extended drain driver circuit, the well voltage signal being the greater of the voltage at the bond pad connection or a supply voltage to the integrated circuit, such that voltage stress on the extended drain driver circuit is reduced.

2. The circuit of claim 1 wherein the extended drain driver circuit further comprises:

a P-channel extended drain transistor providing an active pull-up to the bond pad connection; and an N-channel extended drain transistor providing an active pull-down to the bond pad connection.

3. The circuit of claim 2, wherein said P-channel extended drain transistor includes a back-well connection and the well voltage signal is operatively coupled to said back-well connection.

4. A failsafe interface circuit for an integrated circuit having a core logic section providing a signal for a bond pad connection, the interface circuit comprising:

an extended drain driver circuit operatively coupled to the bond pad connection;

a failsafe detect circuit providing a bias signal which has a voltage less than a voltage on the bond pad connection during a failsafe event, the bias signal generated by said failsafe detect circuit during a failsafe event is in the range of ½ to ¾ of the voltage on the bond pad connection;

a failsafe gate switch circuit interposed between the core logic section and said extended drain driver circuit, said failsafe gate switch circuit being responsive to an output signal from the core logic section during normal operation and being responsive to the bias signal, and creating a substantially open circuit path between the bond pad connection and the core logic section during a failsafe event; and a failsafe well switch circuit having an output providing a well voltage signal to the extended drain driver circuit, the well voltage signal being the greater of the voltage at the bond pad connection or a supply voltage to the integrated circuit, such that voltage stress on the extended drain driver circuit is reduced.

5. The circuit of claim 4 wherein the bias signal generated by the failsafe detect circuit during a failsafe event is substantially equal to ⅔ of the voltage on the bond pad.

6. A failsafe interface circuit for an integrated circuit having a core logic section providing a signal for a bond pad connection, the interface circuit comprising:

an extended drain driver circuit operatively coupled to the bond pad connection;

a failsafe detect circuit providing a bias signal which has a voltage less than a voltage on the bond pad connection during a failsafe event;

a failsafe gate switch circuit interposed between the core logic section and said extended drain driver circuit, said failsafe gate switch circuit being responsive to an output signal from the core logic section during normal operation and being responsive to the bias signal, and creating a substantially open circuit path between the bond pad connection and the core logic section during a failsafe event, the failsafe gate switch including a pass gate circuit interposed between the core logic section and said extended drain driver circuit, said pass gate circuit comprising:

an extended drain N-channel device having a source terminal coupled to the core logic section, a drain terminal coupled to said output driver circuit and a gate terminal coupled to the supply voltage of the integrated circuit; and an extended drain P-channel device having a drain terminal coupled to the core logic output, a source terminal coupled to the output driver circuit and a gate terminal coupled to a signal LO, the signal LO being low during normal operation and substantially equal to the voltage at the bond pad during a failsafe event; and a failsafe well switch circuit having an output providing a well voltage signal to the extended drain driver circuit, the well voltage signal being the greater of the voltage at the bond pad connection or a supply voltage to the integrated circuit, such that voltage stress on the extended drain driver circuit is reduced.

7. The circuit of claim 6 wherein the well switch circuit comprises:

a first p-channel transistor coupled from the bond pad connection to said well switch circuit output and being responsive to the bias signal; and an extended drain p-channel device coupled from the well switch circuit output to the integrated circuit supply voltage and being responsive to the signal LO.

* * * * *